United States Patent
Sridharan

(10) Patent No.: US 9,578,424 B2
(45) Date of Patent: Feb. 21, 2017

(54) FREQUENCY MODULATED MICROPHONE SYSTEM

(71) Applicant: Robert Bosch GmbH, Stuttgart (DE)

(72) Inventor: Sucheendran Sridharan, McMurray, PA (US)

(73) Assignee: Robert Bosch GmbH, Stuttgart (DE)

( * ) Notice: Subject to any disclaimer, the term of this patent is extended or adjusted under 35 U.S.C. 154(b) by 20 days.

(21) Appl. No.: 14/702,626

(22) Filed: May 1, 2015

(65) Prior Publication Data

US 2015/0319538 A1     Nov. 5, 2015

Related U.S. Application Data

(60) Provisional application No. 61/987,198, filed on May 1, 2014.

(51) Int. Cl.
| | |
|---|---|
| *H04R 25/00* | (2006.01) |
| *H04R 23/00* | (2006.01) |
| *H04R 19/00* | (2006.01) |
| *H04R 3/00* | (2006.01) |
| *H01L 29/84* | (2006.01) |

(52) U.S. Cl.
CPC ............ *H04R 23/00* (2013.01); *H04R 19/005* (2013.01); *H04R 2201/003* (2013.01)

(58) Field of Classification Search
USPC .... 381/174, 113; 29/594; 257/415, 416, 419
See application file for complete search history.

(56) References Cited

U.S. PATENT DOCUMENTS

| | | |
|---|---|---|
| 4,182,315 A | 1/1980 | Vas et al. |
| 6,928,173 B2 | 8/2005 | Akino |
| 7,119,550 B2 | 10/2006 | Kitano et al. |
| 8,436,435 B2 | 5/2013 | Chan et al. |
| 8,629,700 B2 | 1/2014 | Feng et al. |

(Continued)

OTHER PUBLICATIONS

Pedersen et al., "An integrated silicon capacitive microphone with frequency-modulated digital output," Sensors and Actuators A 69 (1998) pp. 267-275.

(Continued)

*Primary Examiner* — Sunita Joshi
(74) *Attorney, Agent, or Firm* — Michael Best & Friedrich LLP

(57) ABSTRACT

Systems and methods of sensing audio with a MEMS microphone that modulates a frequency of a phase-locked loop. The MEMS microphone includes a movable electrode and a stationary electrode. The movable electrode is configured such that acoustic pressures acting on the movable electrode cause movement of the movable electrode. A voltage-controlled oscillator of the phase-locked loop is coupled to the MEMS microphone and receives a control signal. The voltage-controlled oscillator also generates an oscillating signal based on the control signal and a capacitance between the movable electrode and the stationary electrode. A phase detector of the phase-locked loop receives and determines a phase difference between the oscillating signal and a reference signal. The phase detector further generates the control signal based on the phase difference. A controller is configured to receive the control signal and determine an audio signal based on the control signal.

19 Claims, 8 Drawing Sheets

(56) References Cited

U.S. PATENT DOCUMENTS

| | | | |
|---|---|---|---|
| 2003/0007650 A1* | 1/2003 | Akino | H04R 19/04 381/113 |
| 2010/0329487 A1* | 12/2010 | David | H03F 3/187 381/174 |
| 2013/0208915 A1 | 8/2013 | Hammerschmidt et al. | |

OTHER PUBLICATIONS

International Search Report and Written Opinion for Application No. PCT/US2015/028953 dated Jul. 24, 2015 (13 pages).
International Preliminary Report on Patentability for Application No. PCT/US2015/028953 dated May 10, 2016 (7 pages).

* cited by examiner

FREQUENCY MODULATED MICROPHONE SYSTEM

RELATED APPLICATIONS

This application claims priority to U.S. Provisional Application No. 61/987,198, filed on May 1, 2014 and titled "FREQUENCY MODULATED MICROPHONE SYSTEM," the entire contents of which is incorporated by reference.

BACKGROUND

Embodiments of the invention relate to systems and methods of sensing audio with a microphone using frequency modulation. More specifically, the embodiments of the invention relate to audio sensing with a micro-electro-mechanical system (MEMS) microphone.

SUMMARY

In some implementations, one embodiment of the invention provides, among other things, a microphone system. The microphone system includes a MEMS microphone, a phase-locked loop, and a controller. The MEMS microphone includes a movable electrode and a stationary electrode. The movable electrode has a first side and a second side that is opposite the first side. The movable electrode is configured such that acoustic pressures acting on the first side and the second side of the movable electrode cause movement of the movable electrode. The stationary electrode is positioned on the first side of the movable electrode. The phase-locked loop includes a voltage-controlled oscillator and a phase detector. The voltage-controlled oscillator is coupled to the MEMS microphone. The voltage-controlled oscillator receives a control signal. The voltage-controlled oscillator generates an oscillating signal based on the control signal and a capacitance between the movable electrode and the stationary electrode. The phase detector is coupled to the voltage-controlled oscillator. The phase detector receives the oscillating signal and a reference signal. The phase detector detects a phase difference between the oscillating signal and the reference signal. The phase detector also generates the control signal based on the phase difference. The controller is coupled to the phase-locked loop. The controller is configured to receive the control signal and determine an audio signal based on the control signal.

In other implementations, the invention provides a method of sensing audio with a MEMS microphone. The MEMS microphone includes a movable electrode and a stationary electrode. The movable electrode has a first side and a second side that is opposite the first side. The movable electrode is configured such that acoustic pressures acting on the first side and the second side of the movable electrode cause movement of the movable electrode. The stationary electrode is positioned on the first side of the movable electrode. The method includes receiving, with a voltage-controlled oscillator, a control signal. The method also includes generating, with the voltage-controlled oscillator, an oscillating signal based on the control signal and a capacitance between the movable electrode and the stationary electrode. The method further includes receiving, with a phase detector, the oscillating signal and a reference signal. The method also includes detecting, with the phase detector, a phase difference between the oscillating signal and the reference signal. The method further includes generating, with the phase detector, the control signal based on the phase difference. The method also includes receiving, with a controller, the control signal. The method further includes determining, with the controller, an audio signal based on the control signal.

Other aspects of the invention will become apparent by consideration of the detailed description and accompanying drawings.

DETAILED DESCRIPTION

Figure 1:
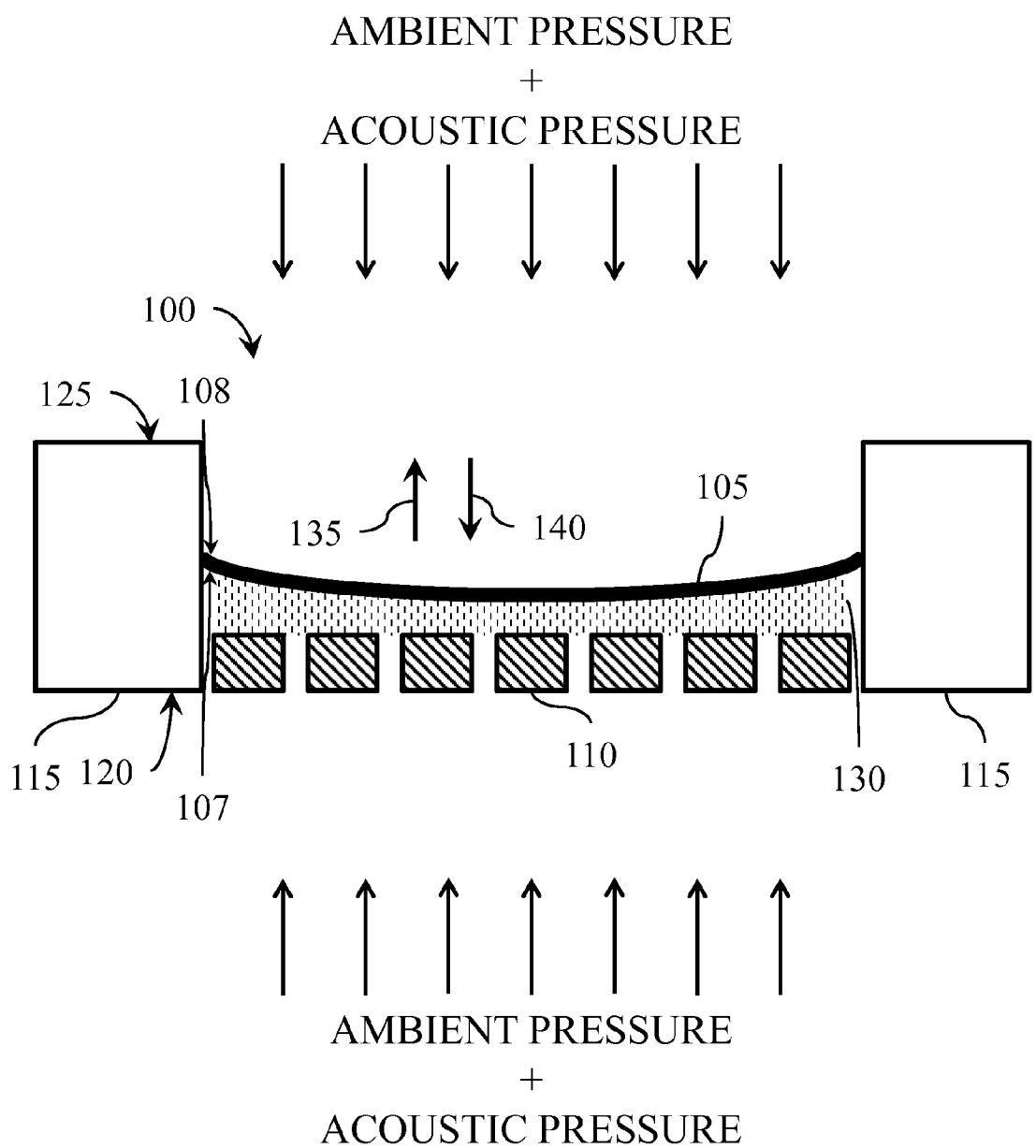
FIG. 1 is a cross-sectional side view of a MEMS microphone.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Also, it is to be understood that the phraseology and terminology used herein is for the purpose of description and should not be regarded as limiting. The use of "including," "comprising" or "having" and variations thereof herein is meant to encompass the items listed thereafter and equivalents thereof as well as additional items. The terms "mounted," "connected" and "coupled" are used broadly and encompass both direct and indirect mounting, connecting and coupling. Further, "connected" and "coupled" are not restricted to physical or mechanical connections or couplings, and can include electrical connections or couplings, whether direct or indirect. Also, electronic communications and notifications may be performed using other known means including direct connections, wireless connections, etc.

It should also be noted that a plurality of hardware and software based devices, as well as a plurality of different structural components may be utilized to implement the invention. Furthermore, and as described in subsequent paragraphs, the specific configurations illustrated in the drawings are intended to exemplify embodiments of the invention. Alternative configurations are possible.

In some implementations, a MEMS microphone 100 includes, among other components, a movable electrode 105 (e.g., membrane) having a first side 107 and a second side 108, a stationary electrode 110, and a barrier 115, as illustrated in FIG. 1. The stationary electrode 110 is positioned on the first side 107 of the movable electrode 105. The barrier 115 isolates a first side 120 and a second side 125 of the MEMS microphone 100.

In some implementations, the movable electrode 105 is kept at a reference voltage and a bias voltage is applied to the stationary electrode 110 to generate an electric sense field 130 between the movable electrode 105 and the stationary electrode 110. The electric sense field 130 is illustrated in FIG. 1 as a plurality of vertical dashes. In other implementations, the stationary electrode 110 is kept at the reference voltage and the bias voltage is applied to the movable electrode 105 to generate the electric sense field 130. In some implementations, the reference voltage is a ground reference voltage (i.e., approximately 0 Volts). In other implementations, the reference voltage is a non-zero voltage.

Acoustic and ambient pressures acting on the first side 107 and the second side 108 of the movable electrode 105 cause deflection of the movable electrode 105 in the directions of arrows 135 and 140. The deflection of the movable electrode 105 modulates the electric sense field 130 between the movable electrode 105 and the stationary electrode 110. A capacitance between the movable electrode 105 and the stationary electrode 110 varies based on the electric sense field 130.

Figure 2:
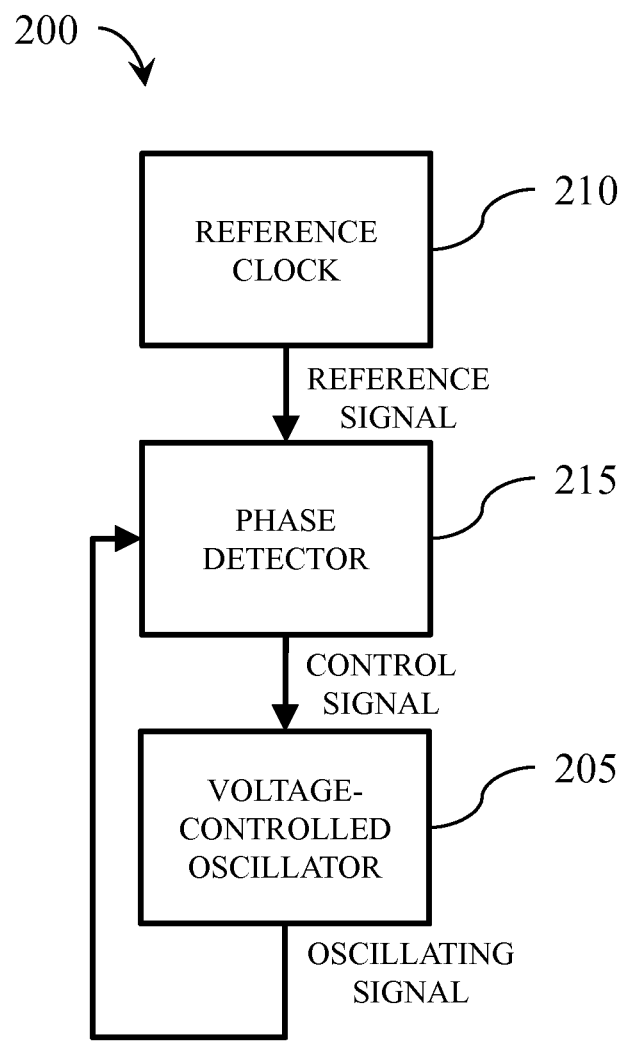
FIG. 2 is a block diagram of a phase-locked loop.

A phase-locked loop 200 is a control system that generates an output signal whose phase is related to the phase of the input signal. In some embodiments, a phase-locked loop 200 includes, among other components, a voltage-controlled oscillator 205, a reference clock 210, and a phase detector 215, as illustrated in FIG. 2.

The voltage-controlled oscillator 205 receives a control signal and generates an oscillating signal based on the control signal. In some implementations, the control signal is a voltage signal. The oscillating signal is a voltage signal that oscillates between to two different voltage levels. The frequency of the oscillating signal correlates in part to the control signal. In some implementations, the voltage-controlled oscillator 205 includes, among other components, an electronic oscillator.

The reference clock 210 generates a reference signal. The reference signal is a voltage signal that alternates (i.e., oscillates) between two different voltage levels. In some implementations, the frequency of the reference signal is substantially constant. In some implementations, the reference clock 210 includes, among other components an electronic oscillator.

The phase detector 215 receives the oscillating signal and the reference signal and generates the control signal. The phase detector 215 generates the control signal based on a comparison of the oscillating signal and the reference signal. In some implementations, the phase detector 215 generates the control signal by comparing the phase of the oscillating signal and the phase of the reference signal. The phase of the oscillating signal correlates to the frequency of the oscillating signal. Likewise, the phase of the reference signal correlates to the frequency of the reference signal. The phase detector 215 adjusts the control signal to align the phase of oscillating signal in sync with the phase of the reference signal. The control signal is substantially constant when the phases match. The control signal shifts up and down based on whether the phase of the oscillating signal is leading or lagging the phase of the reference signal. In some implementations, the frequency of the reference signal is substantially constant and the control signal directly correlates to the frequency of the oscillating signal.

Figure 3:
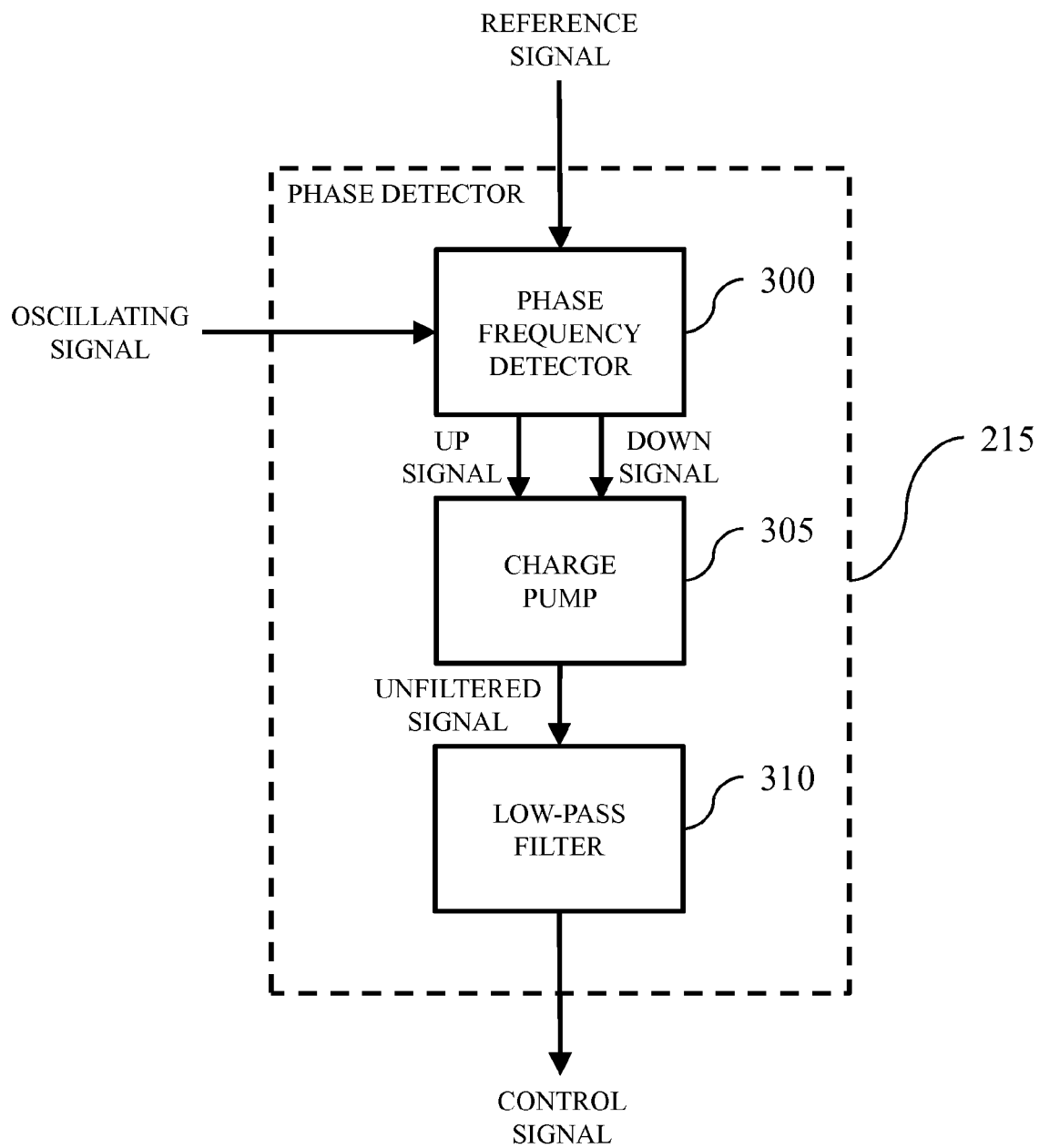
FIG. 3 is a block diagram of a phase detector in the phase-locked loop of FIG. 2.

In some implementations, the phase detector 215 includes, among other components, a phase frequency detector 300, a charge pump 305, and a low-pass filter 310, as illustrated in FIG. 3. The phase frequency detector 300 receives the oscillating signal and the reference signal. The phase frequency detector 300 compares the phase of the oscillating signal and the phase of the reference signal. The phase frequency detector 300 generates an up signal and a down signal (e.g., high and low voltage signals) based on whether the phase of the oscillating signal is lagging or the leading the phase of the reference signal (i.e., the phase difference). The charge pump 305 converts the up signal and the down signal into a single unfiltered signal. In some implementations, the charge pump 305 includes, among other components, a DC-to-DC converter that uses capacitors as energy storage elements to create either a higher or lower voltage power source. The low-pass filter 310 converts the unfiltered signal into the control signal.

Figure 4:
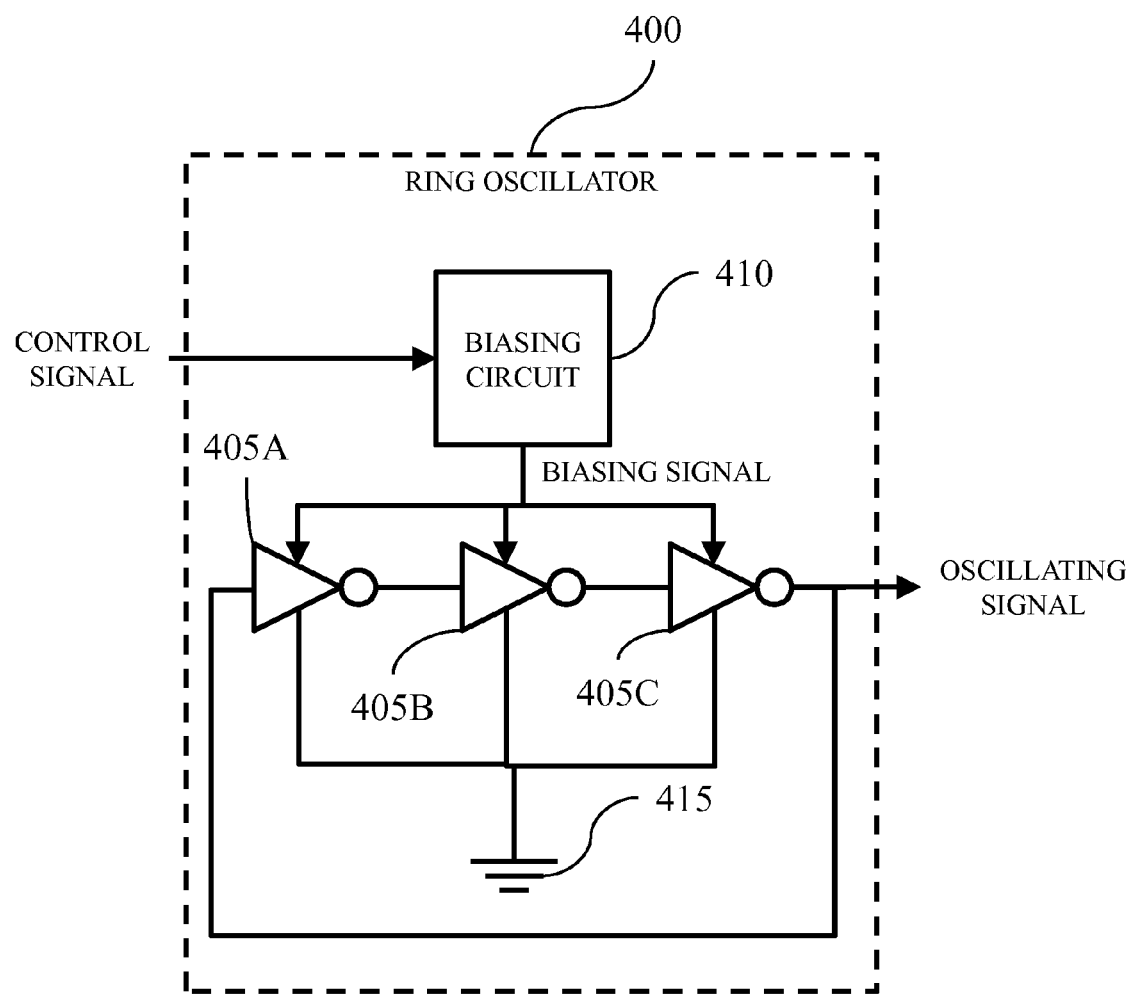
FIG. 4 is a block diagram of a ring oscillator.

In some implementations, the voltage-controlled oscillator 205 includes, among other components, a ring oscillator 400. A ring oscillator 400 includes, among other components, a plurality of inverters 405A-405C and a biasing circuit 410, as illustrated in FIG. 4. The plurality of inverters 405A-405C is configured in a series circuit configuration. The biasing circuit 410 receives the control signal and generates a biasing signal that is based on the control signal. The biasing circuit 410 provides the biasing voltage to each of the plurality of inverters 405A-405C. Each inverter in the plurality of inverters 405A-405C is coupled to a reference node 415 (e.g., ground).

In order for the oscillating signal to oscillate, the ring oscillator 400 requires an odd number of inverters. For example, the ring oscillator 400 illustrated in FIG. 4 includes three inverters. Each inverter contributes an amount of propagation delay to the chain of inverters. Propagation delay is the length of time required to change an output of a system in response to a change in an input of the system. The frequency of the oscillating signal correlates in part to the sum of the propagation delays of each of the plurality of inverters 405A-405C. Table #1 illustrates exemplary propagation delays for the ring oscillator 400 caused by a plurality of different inverter propagation delays. The values of propagation delay in table #1 are in microseconds (µS).

The frequency of the oscillating signal is affected by the control signal and the propagation delay of the ring oscillator 400. Each of the plurality of inverters 405A-405C include capacitive elements (e.g., load capacitors) having a load capacitance that affect its propagation delay. Changing the load capacitance of at least one of the plurality of inverters 405A-405C in the ring oscillator 400 alters the frequency of the oscillating signal.

Figure 5:
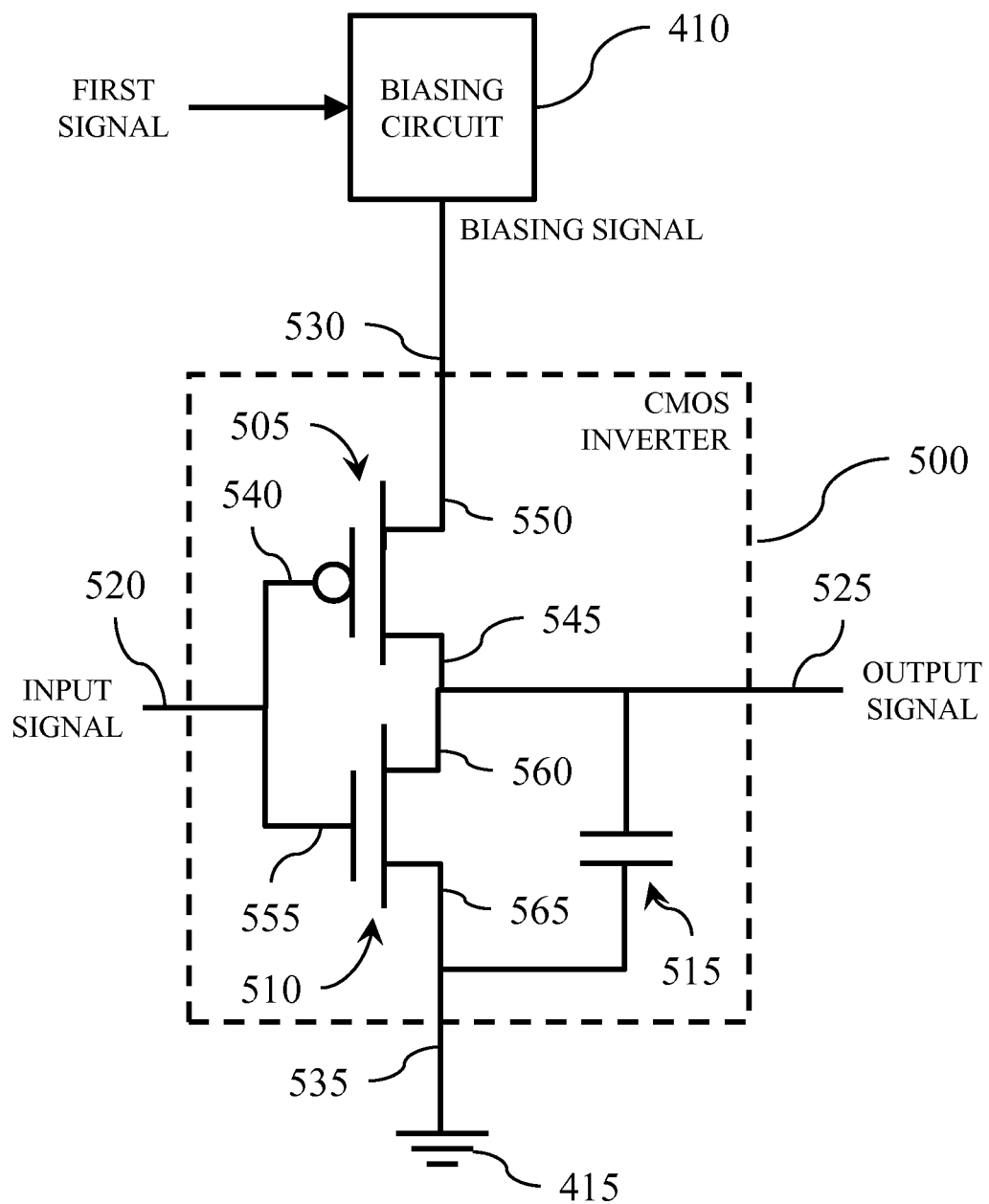
FIG. 5 is a block diagram of a CMOS inverter in the ring oscillator of FIG. 4.

In some implementations, each of the plurality of inverters 405A-405C is a complementary metal-oxide semiconductor (CMOS) inverter 500. A CMOS inverter 500 includes, among other components, a P-type metal-oxide semiconductor (PMOS) transistor 505, an N-type metal-oxide semiconductor (NMOS) transistor 510, a load capacitor 515, an input node 520, an output node 525, a high voltage node 530, and a low voltage node 535, as illustrated in FIG. 5. The PMOS transistor 505 includes a gate node 540, a drain node 545, and a source node 550. The NMOS transistor 510 includes a gate node 555, a drain node 560, and a source node 565. The gate node 540 of the PMOS transistor 505 and the gate node 555 of the NMOS transistor 510 are coupled to the input node 520. The drain node 545 of the PMOS transistor 505 and the drain node 560 of the NMOS transistor 510 are coupled to the output node 525. The source node 550 of the PMOS transistor 505 is coupled to the high voltage node 530. The source node 565 of the NMOS transistor 510 is coupled to the low voltage node 535. The load capacitor 515 is coupled between output node 525 and the low voltage node 535.

The CMOS inverter 500 receives an input signal (e.g., input voltage signal) at the input node 520 and generates an output signal (e.g., output voltage signal) at the output node

525. The input signal and output signal alternate between a high voltage value and a low voltage value. The output signal is at the high voltage value when the input signal is at the low voltage and the output signal is at the low voltage value when the input signal is at the high input value. The high voltage value is regulated by the biasing signal and the low voltage value is regulated by the voltage of the reference node 415 (e.g., approximately 0 volts). The propagation delay of the CMOS inverter 500 is the length of time required to change the output signal in response to a change in the input signal. The propagation delay of the CMOS inverter 500 correlates to the time required to charge and discharge the load capacitor 515 between the low voltage value and the high voltage value.

Figure 6:
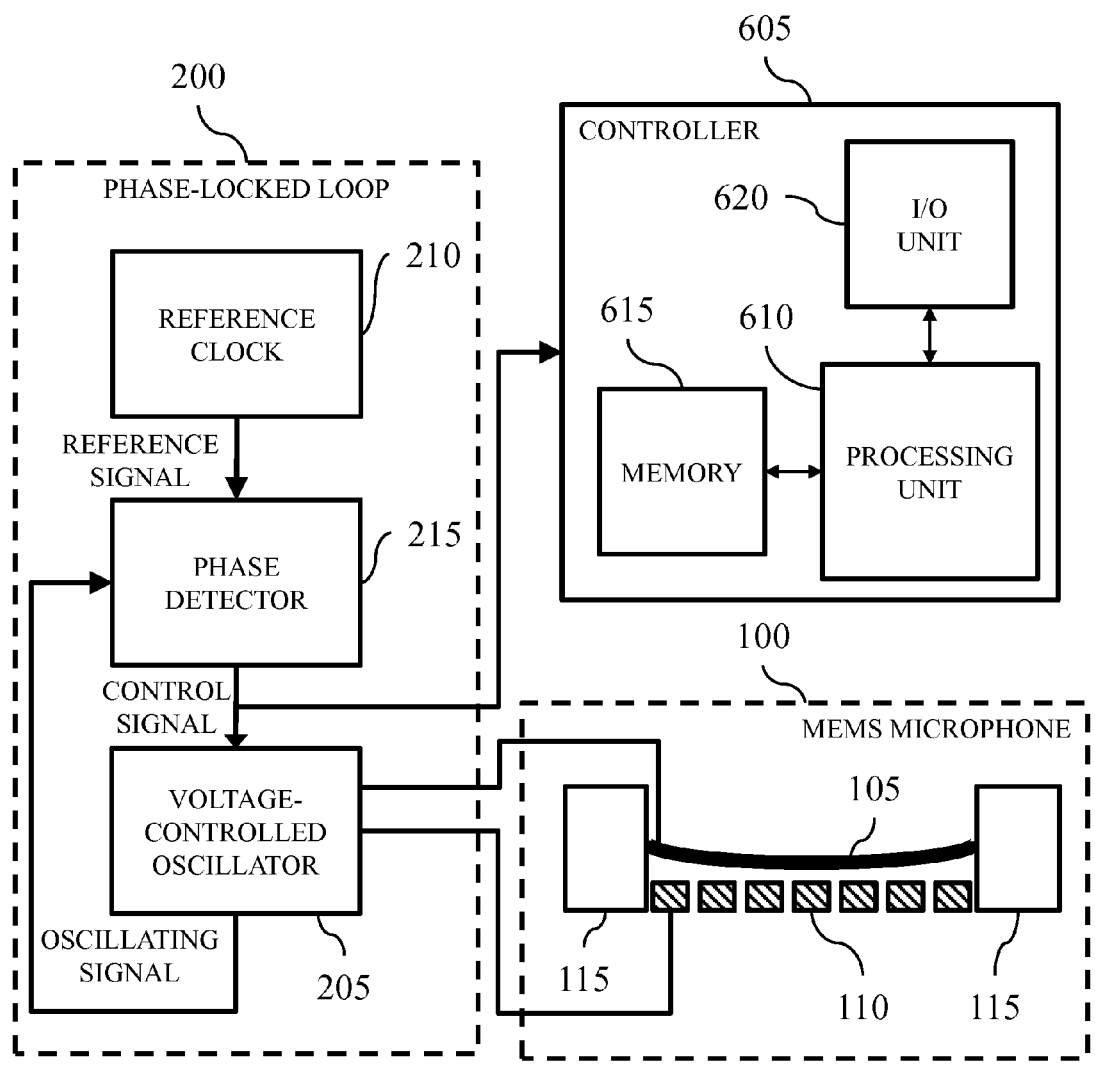
FIG. 6 is a block diagram of a microphone system.

In some implementations, a microphone system 600 includes, among other components, the MEMS microphone 100, the phase-locked loop 200, and a controller 605, as illustrated in FIG. 6. The movable electrode 105 and the stationary electrode 110 are coupled to the voltage-controlled oscillator 205 such that the capacitance between them acts as a load capacitance for the voltage-controlled oscillator 205. As explained above, the capacitance between the movable electrode 105 and the stationary electrode 110 changes based on acoustic and ambient pressures acting on the movable electrode 105. Also, as explained above, the control signal correlates to the frequency of the oscillating signal. As explained below in further detail, the frequency of the oscillating signal correlates in part to the capacitance between the movable electrode 105 and the stationary electrode 110. Therefore, the control signal changes based on the acoustic and ambient pressures acting on the movable electrode 105.

The controller 605 includes combinations of software and hardware that are operable to, among other things, determine an audio signal based on the capacitance between the movable electrode 105 and the stationary electrode 110. In one implementation, the controller 605 includes a printed circuit board (PCB) that is populated with a plurality of electrical and electronic components that provide, power, operational control, and protection to the microphone system 600. In some implementations, the PCB includes, for example, a processing unit 610 (e.g., a microprocessor, a microcontroller, or another suitable programmable device), a memory 615, and a bus. The bus connects various components of the PCB including the memory 615 to the processing unit 610. The memory 615 includes, for example, a read-only memory (ROM), a random access memory (RAM), an electrically erasable programmable read-only memory (EEPROM), a flash memory, a hard disk, or another suitable magnetic, optical, physical, or electronic memory device. The processing unit 610 is connected to the memory 615 and executes software that is capable of being stored in the RAM (e.g., during execution), the ROM (e.g., on a generally permanent basis), or another non-transitory computer readable medium such as another memory or a disc. Additionally or alternatively, the memory 615 is included in the processing unit 610. The controller 605 also includes an input/output (I/O) unit 620 that includes routines for transferring information and electric signals between components within the controller 605 and other components of the microphone system 600 or components external to the microphone system 600.

Software included in some implementations of the microphone system 600 is stored in the memory 615 of the controller 605. The software includes, for example, firmware, one or more applications, program data, one or more program modules, and other executable instructions. The controller 605 is configured to retrieve from memory 615 and execute, among other components, instructions related to the control processes and methods described herein. In some implementations, the controller 605 includes additional, fewer, or different components.

The PCB also includes, among other components, a plurality of additional passive and active components such as resistors, capacitors, inductors, integrated circuits, and amplifiers. These components are arranged and connected to provide a plurality of electrical functions to the PCB including, among other things, filtering, signal conditioning, or voltage regulation. For descriptive purposes, the PCB and the electrical components populated on the PCB are collectively referred to as the controller 605.

The controller 605 is coupled to the phase-locked loop 200 and receives the control signal. The controller 605 determines an audio signal based on the control signal. As explained above, the control signal changes based on acoustic and ambient pressures acting on the movable electrode 105. Therefore, the controller 605 uses the control signal to determine the audio signal based on acoustic and ambient pressures acting on the movable electrode 105. In some implementations, the controller 605 measures a parameter (e.g., voltage, current) of the control signal and determines the audio signal based on the measured parameter.

Figure 7:
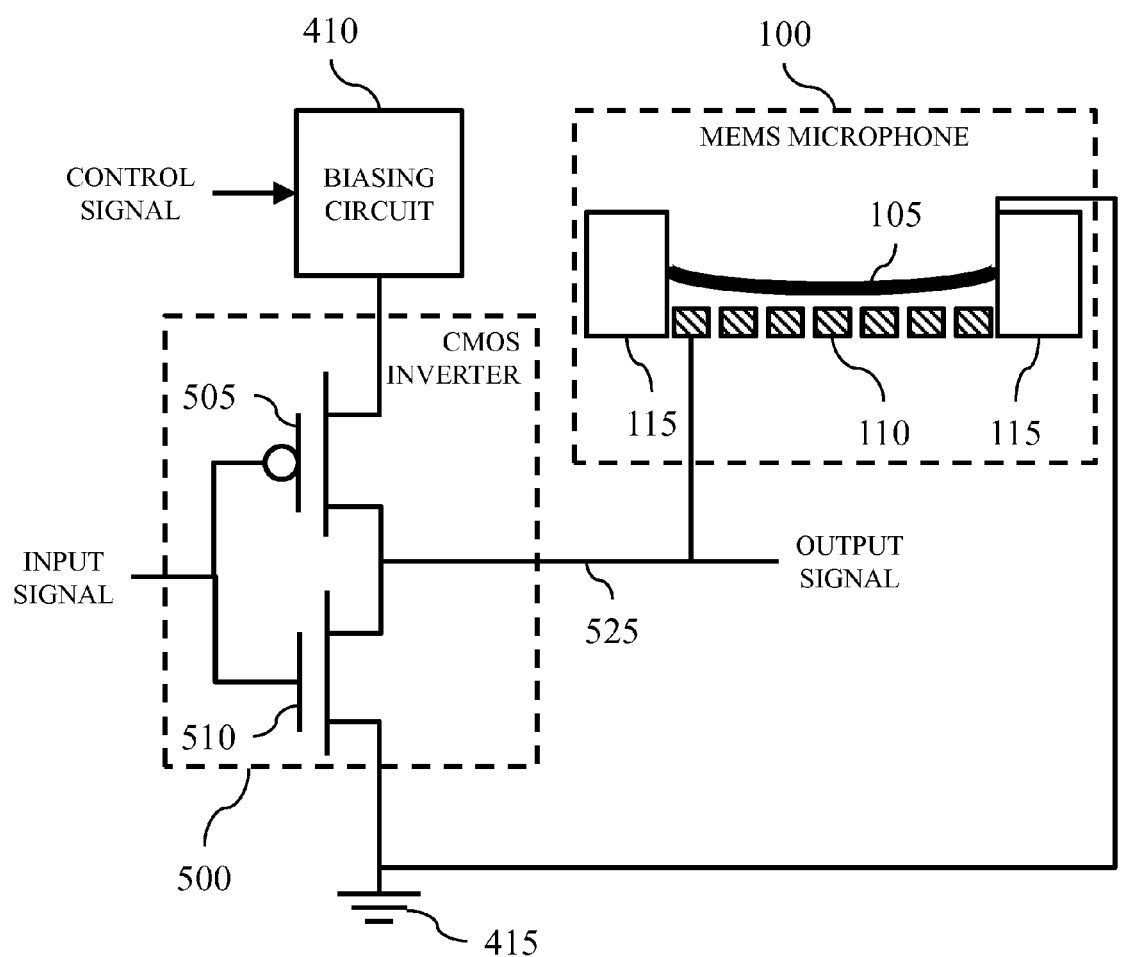
FIG. 7 is a block diagram of the MEMS microphone of FIG. 1 and the CMOS inverter of FIG. 5.

FIG. 7 illustrates an exemplary configuration of the MEMS microphone 100 and a CMOS inverter 500 in the voltage-controlled oscillator 205, in accordance with some implementations of the invention. The stationary electrode 110 is coupled to the output node 525 of the CMOS inverter 500 and the movable electrode 105 is coupled to the reference node 415. The MEMS microphone 100 provides a load capacitance to the CMOS inverter 500. The load capacitance of the CMOS inverter 500 changes as a function of acoustic and ambient pressures acting on the movable electrode 105. This in turn causes the propagation delay of the CMOS inverter 500 to change. Changing the propagation delay of the CMOS inverter 500 modulates the frequency of the oscillating signal. Therefore, the frequency of the oscillating signal correlates in part to the capacitance between the movable electrode 105 and the stationary electrode 110.

Figure 8:
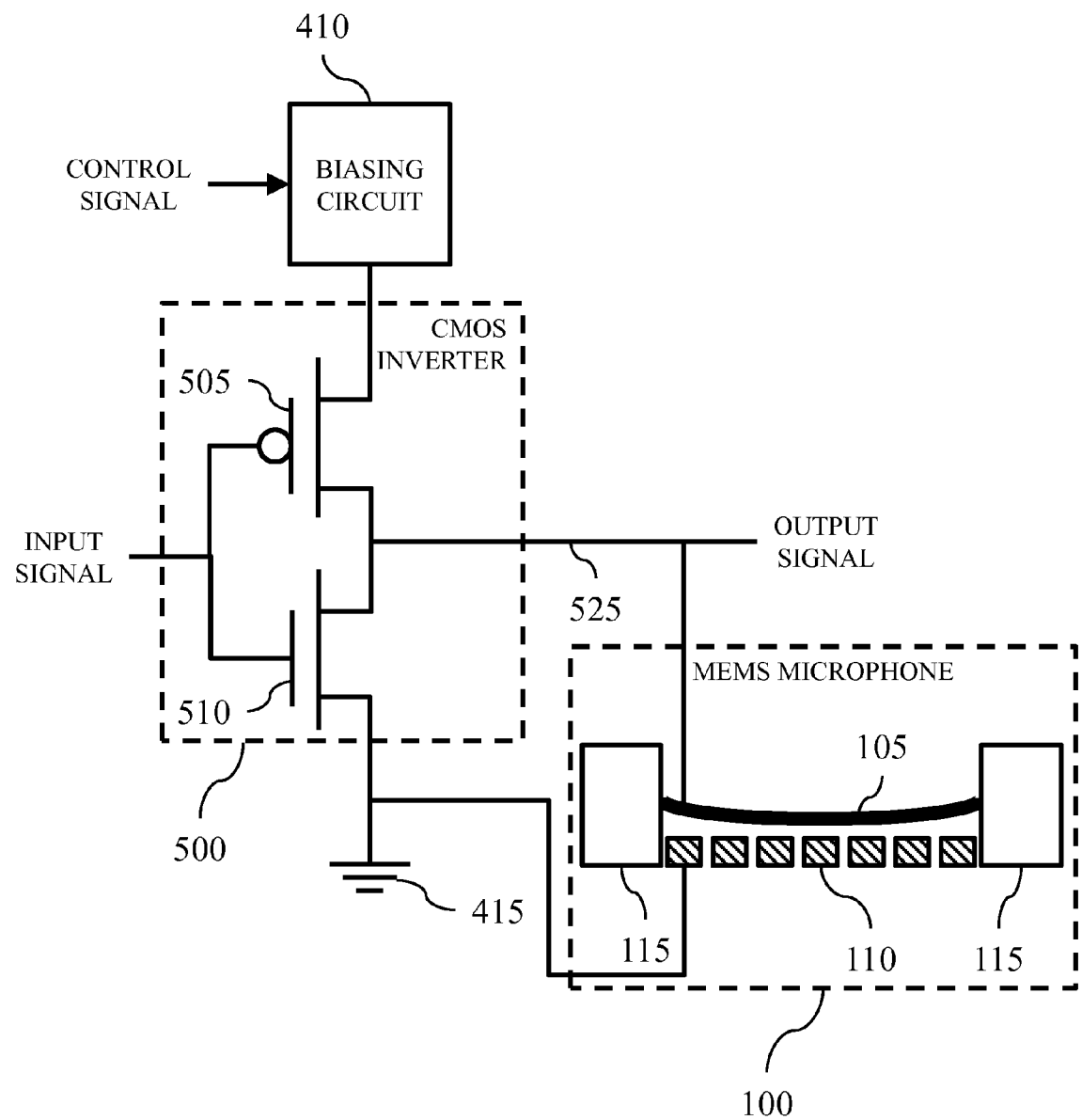
FIG. 8 is a block diagram of the MEMS microphone of FIG. 1 and the CMOS inverter of FIG. 5.

FIG. 8 illustrates an exemplary configuration of the MEMS microphone 100 and a CMOS inverter 500 in the voltage-controlled oscillator 205, in accordance with some implementations of the invention. The movable electrode 105 is coupled to the output node 525 of the CMOS inverter 500 and the stationary electrode 110 is coupled to the reference node 415.

Coupling the movable electrode 105 and the stationary electrode 110 to the CMOS inverter 500 does not require a high voltage pump and lowers the impedance requirements on oxide in the MEMS microphone 100. This allows for a lower pull-in voltage requirement on MEMS microphone 100, greater process flexibility, and lower power consumption by the microphone system 600.

Thus, the invention provides, among other things, systems and methods of sensing audio with a phase-locked loop 200 whose frequency is modulated by a MEMS microphone 100. Various features and advantages of the invention are set forth in the following claims.

What is claimed is:
1. A microphone system comprising:
  a MEMS microphone including
    a movable electrode having a first side and a second side opposite the first side, the movable electrode configured such that acoustic pressures acting on the first side and the second side of the movable electrode cause movement of the movable electrode, and
a stationary electrode positioned on the first side of the movable electrode;
a phase-locked loop including
a voltage-controlled oscillator coupled to the MEMS microphone, wherein the voltage-controlled oscillator
receives a control signal,
generates an oscillating signal based on the control signal and a capacitance between the movable electrode and the stationary electrode, and
has a propagation delay based on the control signal and the capacitance,
wherein the oscillating signal has a phase based on the propagation delay, and
a phase detector coupled to the voltage-controlled oscillator that
receives the oscillating signal and a reference signal,
detects a phase difference between the oscillating signal and the reference signal, and
generates the control signal based on the phase difference; and
a controller coupled to the phase-locked loop, the controller configured to
receive the control signal, and
determine an audio signal based on the control signal.

2. The microphone system according to claim 1, wherein the oscillating signal has a frequency based on the control signal and the capacitance.

3. The microphone system according to claim 1, wherein the voltage-controlled oscillator has a ring oscillator.

4. The microphone system according to claim 3, wherein the ring oscillator has an inverter with an input node and an output node.

5. The microphone system according to claim 4, wherein the stationary electrode coupled to the output node of the inverter.

6. The microphone system according to claim 5, wherein the movable electrode coupled to a reference node.

7. The microphone system according to claim 4, wherein the movable electrode coupled to the output node of the inverter.

8. The microphone system according to claim 7, wherein the stationary electrode coupled to a reference node.

9. The microphone system according to claim 1, wherein the phase-locked loop further included a reference clock that generates the reference signal.

10. The microphone system according to claim 1, wherein the phase detector has
a phase frequency detector that generates an up signal and a down signal based on the phase difference,
a charge pump that generates an unfiltered signal based on the up signal and the down signal, and
a low-pass filter that generates the control signal based on the unfiltered signal.

11. A method of sensing audio with a MEMS microphone, the MEMS microphone including a movable electrode having a first side and a second side opposite the first side, the movable electrode configured such that acoustic pressures acting on the first side and the second side of the movable electrode cause movement of the movable electrode and a stationary electrode positioned on the first side of the movable electrode, the method comprising:
receiving, with a voltage-controlled oscillator, a control signal;
generating, with the voltage-controlled oscillator, an oscillating signal based on the control signal and a capacitance between the movable electrode and the stationary electrode, wherein the oscillating signal includes a phase based on a propagation delay of the voltage-controlled oscillator, wherein the propagation delay is based on the control signal and the capacitance;
receiving, with a phase detector, the oscillating signal and a reference signal;
detecting, with the phase detector, a phase difference between the oscillating signal and the reference signal;
generating, with the phase detector, the control signal based on the phase difference;
receiving, with a controller, the control signal; and
determining, with the controller, an audio signal based on the control signal.

12. The method according to claim 11, wherein the oscillating signal including a phase based on the control signal and the capacitance.

13. The method according to claim 11, wherein the voltage-controlled oscillator generates the oscillating signal using a ring oscillator.

14. The method according to claim 11, further comprising generating, with a reference clock, the reference signal.

15. The method according to claim 11, further comprising generating, with a biasing circuit, a biasing signal based on the control signal.

16. The method according to claim 15, wherein the oscillating signal generated based on the biasing signal.

17. The method according to claim 11, wherein generating the control signal based on the phase difference includes
generating, with a phase frequency detector, an up signal and a down signal based on the phase difference,
generating, with a charge pump, an unfiltered signal based on the up signal and the down signal, and
generating, with a low-pass filter, the control signal based on the unfiltered signal.

18. A method of sensing audio with a MEMS microphone, the MEMS microphone including a movable electrode having a first side and a second side opposite the first side, the movable electrode configured such that acoustic pressures acting on the first side and the second side of the movable electrode cause movement of the movable electrode and a stationary electrode positioned on the first side of the movable electrode, the method comprising:
receiving, with a voltage-controlled oscillator, a control signal;
generating, with the voltage-controlled oscillator, an oscillating signal based on the control signal and a capacitance between the movable electrode and the stationary electrode;
receiving, with a phase detector, the oscillating signal and a reference signal;
detecting, with the phase detector, a phase difference between the oscillating signal and the reference signal;
generating, with the phase detector, the control signal based on the phase difference;
generating, with a biasing circuit, a biasing signal based on the control signal;
receiving, with a controller, the control signal; and
determining, with the controller, an audio signal based on the control signal.

19. The method according to claim 18, wherein the oscillating signal is generated based on the biasing signal.

* * * * *